United States Patent
Anderson et al.

(10) Patent No.: US 6,542,218 B2
(45) Date of Patent: Apr. 1, 2003

(54) PHOTOLITHOGRAPHIC PROCESS FOR PRODUCING ETCHED PATTERNS ON THE SURFACE OF FINE TUBES, WIRES, OR OTHER THREE DIMENSIONAL STRUCTURES

(75) Inventors: Nathaniel C. Anderson, Pine Island, MN (US); Robert D. Ahmann, Rochester, MN (US)

(73) Assignee: Pemstar, Inc., Rochester, MN (US)

( * ) Notice: Subject to any disclaimer, the term of this patent is extended or adjusted under 35 U.S.C. 154(b) by 0 days.

(21) Appl. No.: 09/946,698

(22) Filed: Sep. 5, 2001

(65) Prior Publication Data

US 2002/0030796 A1 Mar. 14, 2002

Related U.S. Application Data

(62) Division of application No. 09/401,634, filed on Sep. 22, 1999, now Pat. No. 6,391,502.
(60) Provisional application No. 60/101,526, filed on Sep. 23, 1998.

(51) Int. Cl.[7] .......................... G03B 27/58; G03B 27/42
(52) U.S. Cl. ........................................... 355/47; 355/53
(58) Field of Search ........................... 355/52, 53, 55, 355/47, 49, 77, 72, 75, 76; 430/20, 311, 320

(56) References Cited

U.S. PATENT DOCUMENTS

| 5,631,112 | A | | 5/1997 | Tsai et al. ....................... 430/22 |
| 5,741,429 | A | * | 4/1998 | Donadio, III ..................... 216/8 |
| 5,766,238 | A | | 6/1998 | Lau et al. ........................ 623/1 |
| 5,815,904 | A | | 10/1998 | Clubb et al. .................... 29/418 |
| 5,905,007 | A | | 5/1999 | Ho et al. ........................ 430/22 |
| 5,955,776 | A | * | 9/1999 | Ishikawa ....................... 257/618 |
| 6,018,383 | A | * | 1/2000 | Dunn et al. ..................... 355/49 |
| 6,027,863 | A | * | 2/2000 | Donadio, III ................. 430/320 |
| 6,097,472 | A | * | 8/2000 | Tanaka et al. .................. 355/47 |
| 6,107,004 | A | * | 8/2000 | Donadio, III ................. 430/320 |

\* cited by examiner

Primary Examiner—Henry Hung Nguyen
(74) Attorney, Agent, or Firm—Dorsey & Whitney LLP

(57) ABSTRACT

The present invention involves a photolithographic process, and apparatus and material for use therein, for producing etched or eroded areas or holes in a selected pattern on or in the surface of fine workpieces, such as small diameter tubes. One aspect of the present invention is a photolithographic process for producing a selected pattern on a nonplanar surface of a workpiece using at least one mask to define the selected pattern. The process includes the acts of applying a photoresist material to the workpiece and aligning the mask with the nonplanar surface of the workpiece. The mask may have an inner surface that corresponds to the nonplanar surface. The process may also include the acts of exposing and developing the photoresist material.

13 Claims, 9 Drawing Sheets

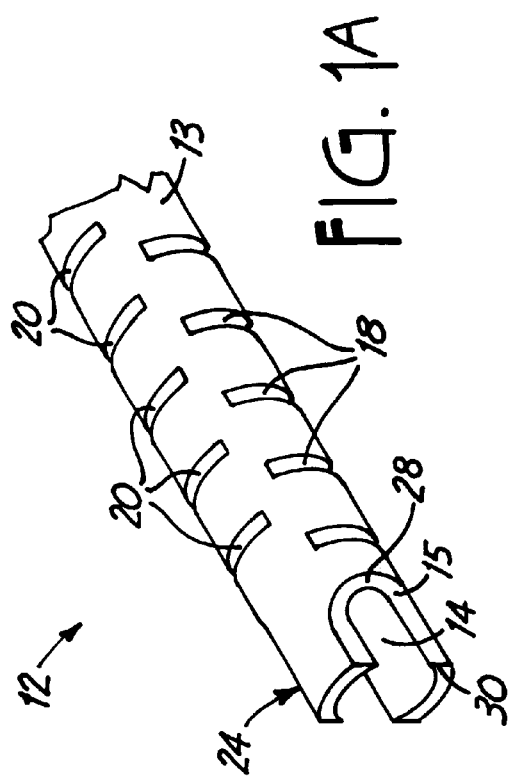
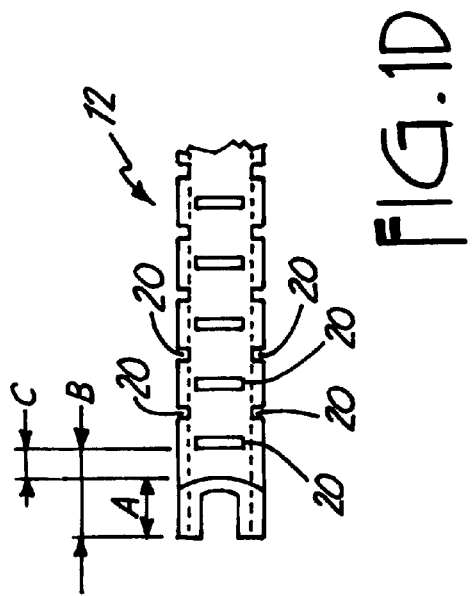
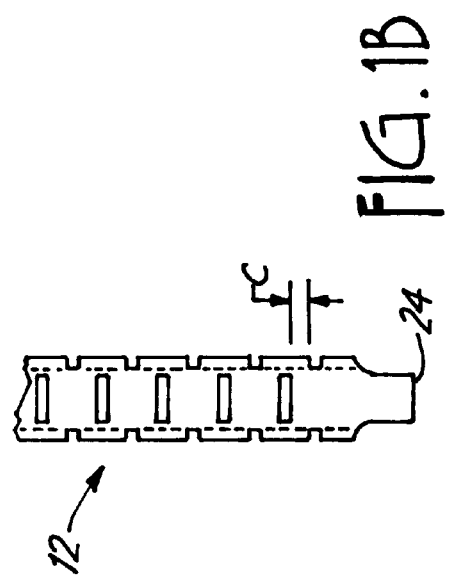
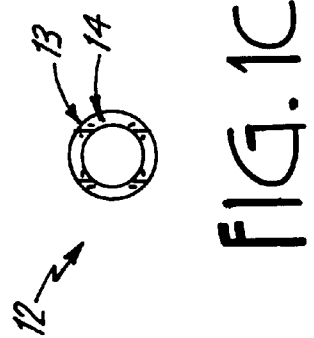

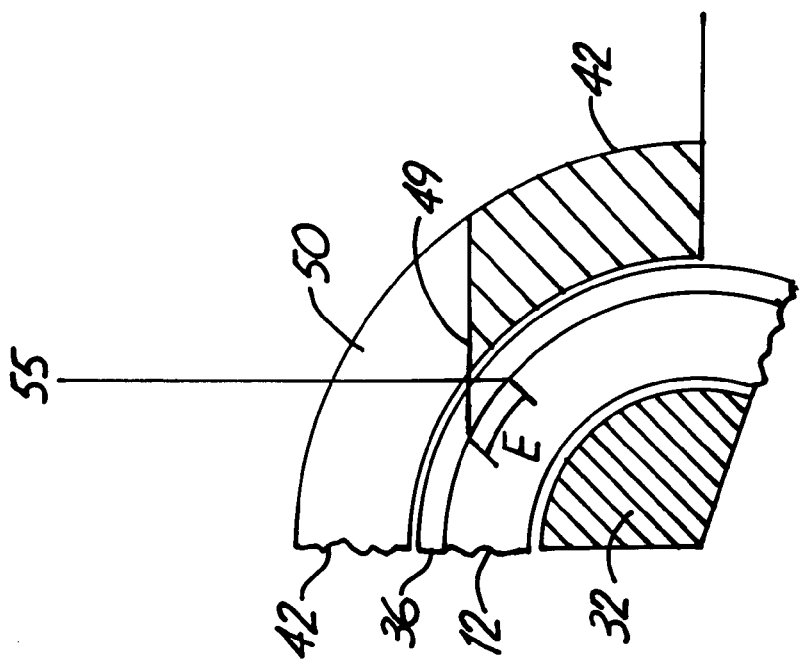
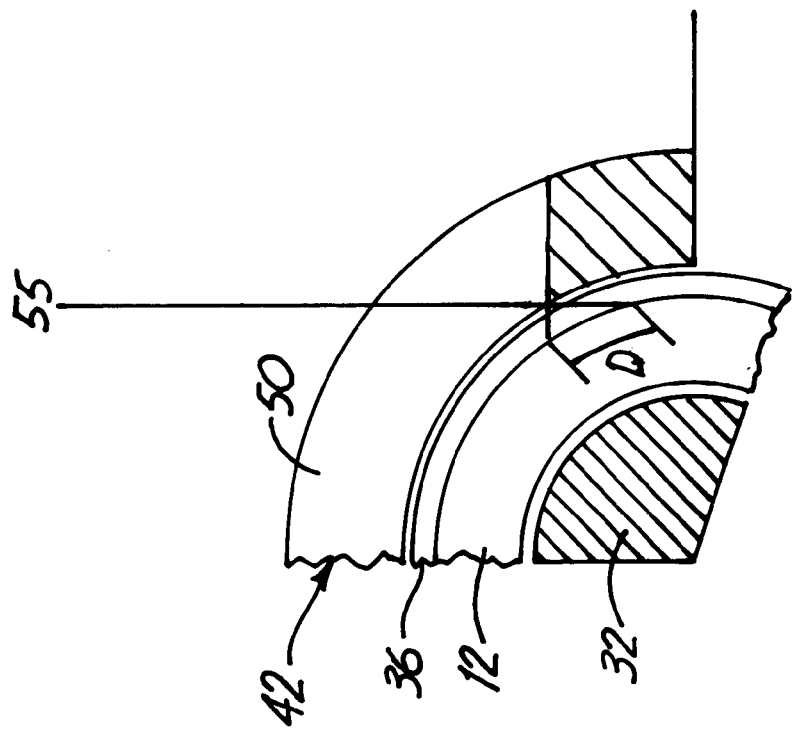

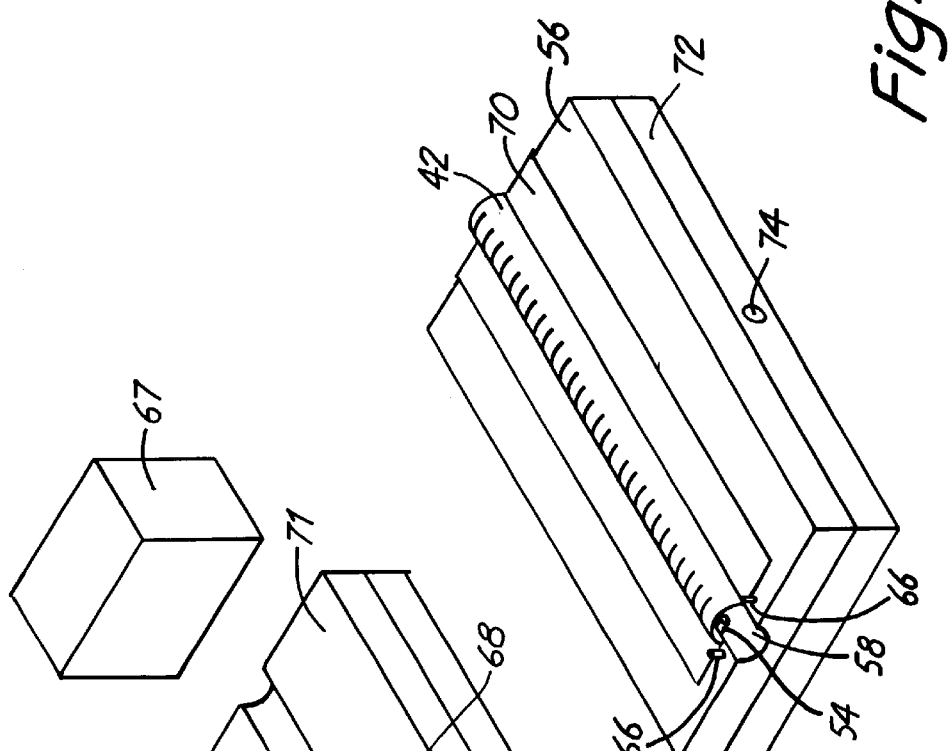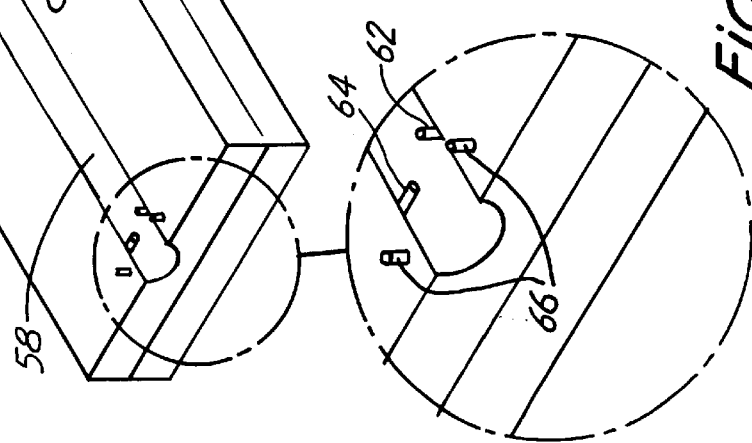

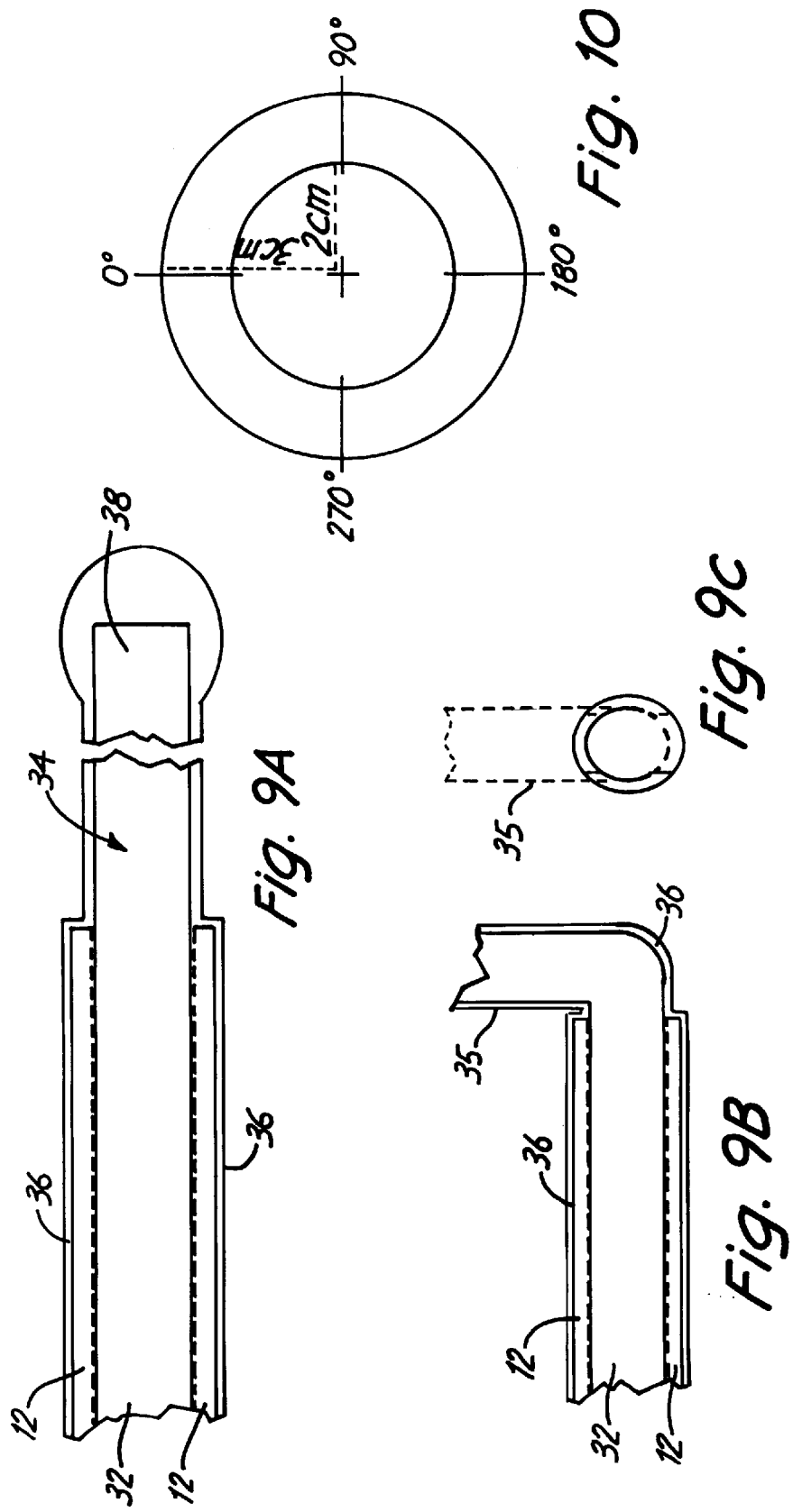

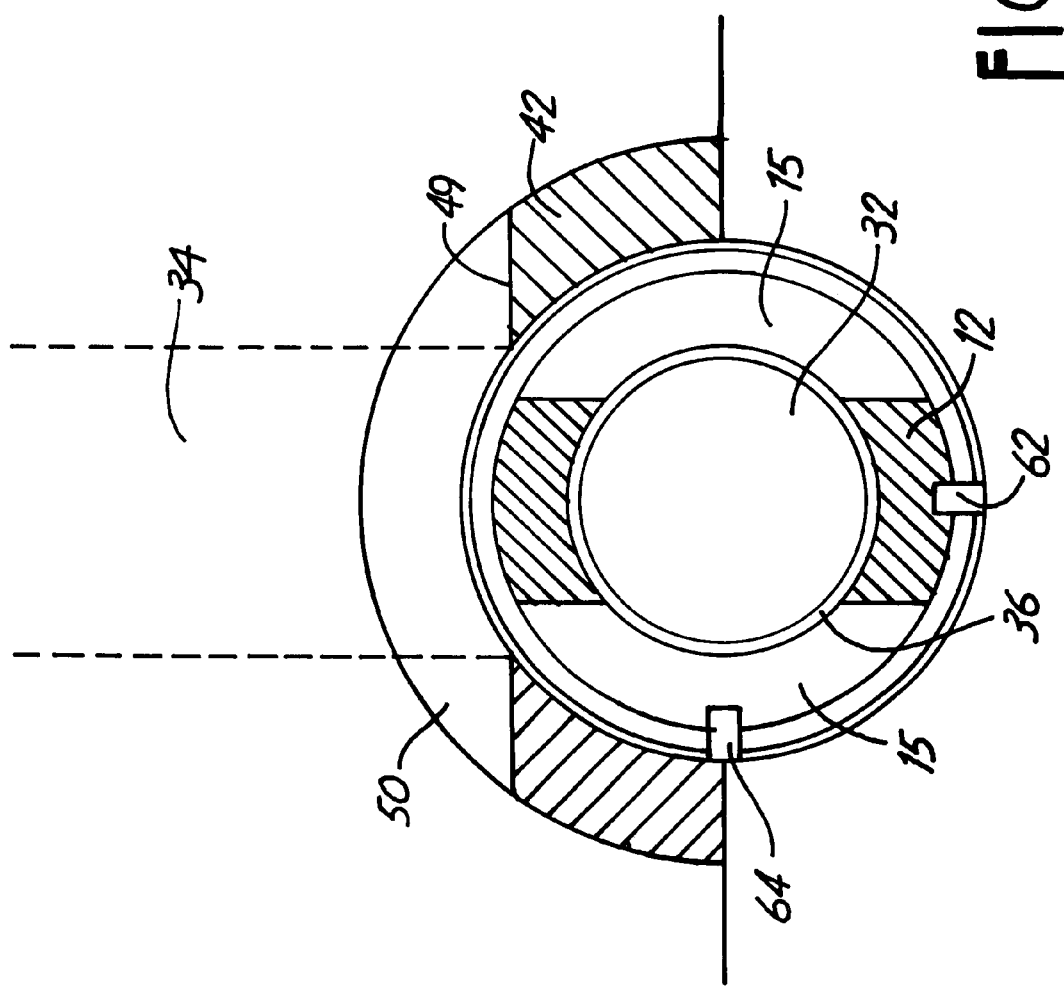

PHOTOLITHOGRAPHIC PROCESS FOR PRODUCING ETCHED PATTERNS ON THE SURFACE OF FINE TUBES, WIRES, OR OTHER THREE DIMENSIONAL STRUCTURES

This application is a divisional of Ser. No. 09/401,634, filed on Sep. 22, 1999 now U.S. Pat. No. 6,391,502 which claims benefit of provisional application Ser. No. 60/101,526, filed on Sep. 23, 1998.

TECHNICAL FIELD

The present invention generally relates to photolithography. More particularly, it involves a photolithographic process, and apparatus and material for use therein, for producing etched or eroded areas or holes in a selected pattern on or in the surface of fine workpieces, such as small diameter tubes.

BACKGROUND

Many applications, particularly in the biomedical field, require a flexible, three dimensional member. Stents, for example, are commonly used in angioplasty procedures for the treatment of coronary artery disease. The afflicted artery is dilated/expanded in these procedures through the use of an angioplasty balloon. Without artificial reinforcement, however, the balloon-expanded vessel has a tendency to constrict to its previous obstructed internal diameter shortly after the angioplasty procedure. By implanting a stent along the expanded portion of the vessel, the vessel is provided with sufficient radial reinforcement to prevent the vessel from constricting.

A variety of conventional techniques exist for manufacturing stents. One such technique involves forming wire members about a cylindrical support member, such as a mandrel, so as to overlap or intertwine with one another. The wire members are joined together at the intersection points using conventional bonding techniques, such as welding, blazing or soldering. Once the wire members are suitably interconnected, the mandrel is removed from the wire members, thereby leaving an elongated wire mesh tube having a plurality of openings defined between the individual wire members. Another conventional manufacturing technique is to cut a pattern of openings into a thin-walled stainless steel tube using electro-mechanical or laser machining techniques.

One problem with these conventional techniques, however, is that they are expensive and time consuming. This problem is compounded because very little cost savings can be achieved by making a large quantity of stents. In addition, stents made by conventional techniques, particularly the techniques using mechanical and electro-mechanical processes, have practical size limitations due to the number of holes or bonds (frequently>4000) required to make the leading 5–6 inches of the stent sufficiently flexible.

One possible solution to these problems is photolithography. Conventional photolithographic techniques are desirable because a manufacturer can use a single mask in conjunction with well-known etching processes to inexpensively produce a large number of stents. Photolithography is also desirable because marginal production costs are substantially independent of the complexity of the desired pattern. That is, although a large number of openings will increase the cost of making the mask, the number of openings will not greatly affect the costs directly associated with making an additional stent.

One problem with conventional "state of the art" photolithographic techniques, however, is that they use a flat mask. This flat mask cannot project a useful image onto the three dimensional and/or nonplanar structures used in medical devices without making complex and expensive changes to the mask pattern. Another problem with conventional "state of the art" photolithography is that the mask patterns are generally fabricated by sputtering metal or other opaque materials onto a smooth glass plate. These plates, however, are fragile and are susceptible to scratching.

Clearly, there is a need for a simple, inexpensive, and robust method and apparatus that can produce a usable photoresist pattern for three-dimensional process requirements. In particular, there is a need to produce usable patterns of photoresist on the surface of relatively fine cylinders, (i.e., 10–15 mil OD tubes or wires) with the objective of permitting the etching by chemical or plasma techniques of a desired texture (wires) or holes (tubes).

SUMMARY

The present invention provides a photolithographic process for producing etched patterns on the surface of fine tubes, wires, or other three dimensional structures. In particular, the present invention produces usable three-dimensional photoresist patterns on the surface of fine cylinders. This photoresist pattern can permit chemical or plasma etching of a desired texture on wires or of desired holes in tubes. One embodiment of the present invention comprises the following apparatus and material: a cleaning agent, a photoresist agent or solution, a mask, a developer solution and a resist remover. An appropriate exposing light source is provided. Each of the preceding may be selected or matched with the composition and configuration of the workpiece and with the solutions or chemicals. The selected mask and/or mask holder may be machined to carry or exhibit a selected pattern of slots or exposure openings, and may include one or more alignment notches, pins or the like. The present invention is well-suited for use on fine cylindrical or tubular workpieces, in which case a curved mask is used. For tubular workpieces, the interior or lumen thereof may be protected from being plugged or occluded by removably lodging a plug therein or by filling it with a suitable removable material.

The present invention also provides a photolithographic method of providing a workpiece with an etched area comprising applying a suitable photoresist material to the workpiece, providing a mask with a desired pattern corresponding to the etched area, aligning the mask and the workpiece, and exposing and developing the photoresist material. More particularly, the process or method of the present invention comprises providing a subject workpiece, applying a suitable photoresist solution to the workpiece, providing a mask with a desired pattern, aligning the mask and the workpiece, exposing the resist, treating the exposed resist in a developer solution, etching the workpiece in an appropriate manner, and removing the resist. Appropriate intervening and complimentary steps may be included in the process of the present invention. For example, the workpiece may be cleaned and dried prior to the application of the photoresist solution, the resist coated workpiece may be baked or otherwise cured, and the workpiece may be rinsed and/or dried after immersion in the developing solution and/or after the application of the resist remover. These steps may involve chemical solutions or agents tailored to the workpiece material, and/or to the selected photoresist, developing and resist removal solutions. The conditions of and in which the process takes place may be optimized for specific applications or workpieces.

Some embodiments of the present invention include a photolithographic process for producing a selected pattern on a nonplanar surface of a workpiece using at least one mask to define the selected pattern. The process comprises the acts of applying a photoresist material to the workpiece and of aligning the mask with a nonplanar surface of the workpiece. The mask in these embodiments may correspond to the nonplanar surface.

The present invention also includes a photolithography apparatus for forming an offset pattern in a tubular workpiece and a photolithographic method of forming a radially spaced offset pattern on a three dimensional workpiece. The photolithography apparatus in some embodiments comprises a stage having a hemicylindrical substrate channel adapted to receive a tubular workpiece, a hemicylindrical mask defining at least one aperture, a first stop associated with the stage and adapted to position the workpiece in a first position relative to the mask, a second stop associated with the stage and adapted to position the workpiece in a second position relative to the mask, and an exposing light source adapted to illuminate the tubular workpiece through the at least one aperture. The photolithographic method in some embodiments comprises the acts of placing a workpiece on a stage, jogging the workpiece against a first stop, exposing a first portion of the photo-sensitive coating through a mask, rotating the workpiece, jogging the workpiece against a second stop, and exposing a second portion of the photo-sensitive coating though the mask. The workpiece in this method has a photo-sensitive coating.

An advantage of the present invention is that it may be used to produce a selected pattern of holes on or in a workpiece having a small cross-sectional area or diameter more cost efficiently than machining. Another advantage of the process of the present invention is that it is well suited for producing a selected pattern of a large number of offset holes on or in a fine cylindrical or tubular workpiece. For example, it may be used to render a workpiece or portion thereof more flexible by providing for the partial or complete erosion of the surface of the workpiece in a pattern comprising a plurality of opposed, offset eroded areas about the circumference of the workpiece for a selected length thereof.

These and other features and advantages of the present invention will become more fully apparent and understood with reference to the enclosed descriptive material and drawings.

BRIEF DESCRIPTION OF THE DRAWINGS

FIG. 1A is a perspective view of a workpiece having a slot pattern produced by the present invention.

FIGS. 1B–1D are, respectively, a top plan view, an end view, and a front view of the workpiece in FIG. 1A.

FIGS. 4 and 5 are sectional views depicting the relationship between arc-length and precision of one embodiment of the present invention.

FIG. 8A is a perspective view of the mask holding fixture of FIGS. 7A–7C with an attached base.

FIG. 8B is a perspective view of the mask holding fixture of FIG. 8A, with the mask removed for clarity.

FIG. 8C is a detailed perspective view of the mask alignment pins in FIGS. 8A and 8B.

FIG. 9A is a sectional view of one selected workpiece having a plug wire and a photoresist coating.

FIG. 9B is a sectional view of the embodiment in FIG. 9A showing the wire plug bent 90° across the workpiece.

FIG. 9C is an end view of the embodiment shown in FIG. 9B.

FIG. 10 is a tube angular indicator.

FIG. 11 is a sectional view of one mask, mask holding fixture, and workpiece with an indicator pointer positioned at 0 degrees.

DETAILED DESCRIPTION

Figure 2:
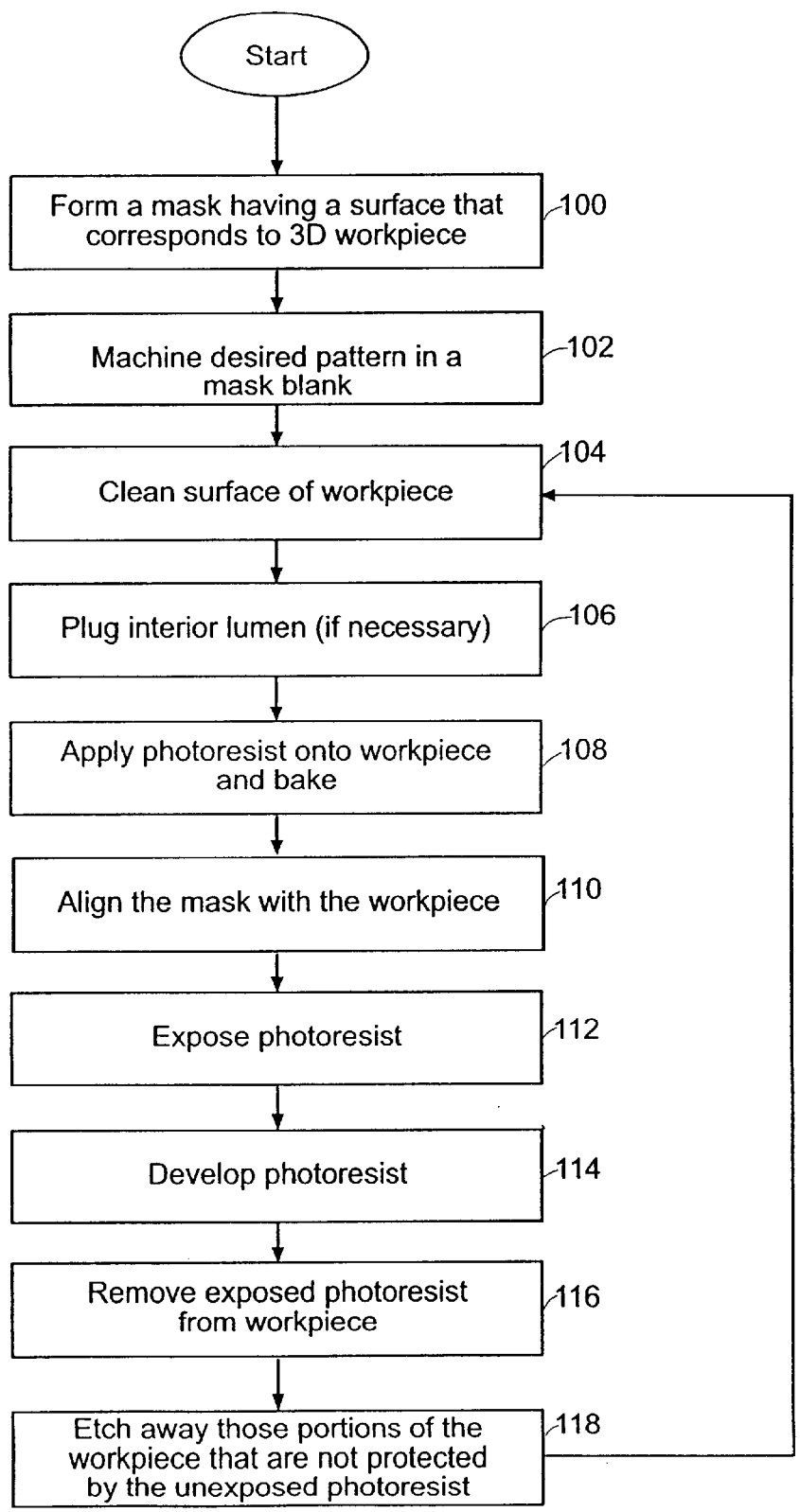
FIG. 2 is a flow chart illustrating one method of making the workpiece in FIGS. 1A–1D.

The present invention depicts a process and an apparatus that may be adapted to create various patterns or shapes in or on a workpiece, including eroded areas of various depths, sizes and shapes. The specific application discussed in this disclosure is providing a pattern for the etching of holes in a NiTi tube (such as Nitinol) to enhance the flexibility of a portion of its length. However, the techniques are equally applicable to producing a texture on a solid workpiece. Those skilled in the art will realize that other applications of these methods and apparatus are also within the scope of the present invention.

The basic solution for this specific application is in the development of a technique where the photomask is a machined hemicylinder (i.e., a half-cylinder) of slightly larger inner diameter ("ID") than the outer diameter ("OD") of the objective pattern receiver, with holes machined in the hemicylindrical mask in a positive image of the desired pattern. The conformity of the mask with the objective allows the production of the desired pattern on the curved surface of the objective wire or tube. The pattern formed on a portion of the target can be stepped around the target by incremental rotation of the target. This invention also includes a process for coating a fine cylindrical surface with a layer of photoresist, for producing a geometrically compliant pattern mask, and for using a rotate/jog technique to form a complex pattern on the surface of said cylinder using a relatively simple mask.

FIGS. 1A–1D depict a tubular workpiece 12 having an exterior surface 13, a cylindrically shaped interior lumen 14, and a slot pattern 18. In this embodiment, the slot pattern 18 consists of a plurality of generally rectangular holes 20 having a width of about two mils and a length of about eight mils. The holes 20 are arranged so that opposite (i.e., 180 degrees apart) holes are directly across from each other and so that adjacent (i.e., 90 degrees apart) holes are staggered by about 2–3 mil. The pattern 18 in this embodiment is formed in the first 5–6 inches of a 5 foot long, 17 mil OD, 10 mil ID Nitinol tube. The objective of the pattern 18 is to render the 5–6 inch length of tube 12 far more flexible and softer than the original tube 12. Those skilled in the art will recognize that other workpiece materials and patterns 18 are within the scope of the present invention.

The tubular workpiece 12 in this embodiment has a pair of U-shaped alignment notches 15 ground into one end 24 of the tube 12. As will be described in more detail with reference to FIGS. 9–11, this alignment notch 15 can be used to help position the tube 12 while using a step/jog technique. Dimension A, the distance between a tip 28 of the notch 15 and a top 30 of the notch 15, is arbitrary. However, dimension A in embodiments using the step/jog technique should be greater than dimension C, the pattern the offset distance. Dimension B, the distance between the tip 28 and the pair of holes 20 closest to the tip 28, should equal the sum of dimensions A and C.

Figure 3H:
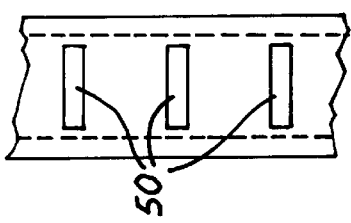
FIGS. 3H–3J are top plan, sectional, and side detail views of a second rectangular slot pattern embodiment for the three-dimensional mask of FIG. 3A.
Figure 3E:
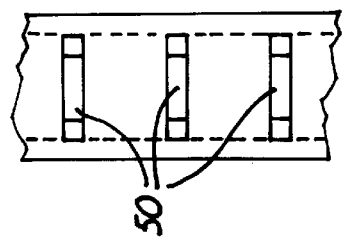
FIGS. 3E–3G are top plan, sectional, and side detail views of an oval slot pattern embodiment for the three-dimensional mask of FIG. 3A.
Figure 3B:
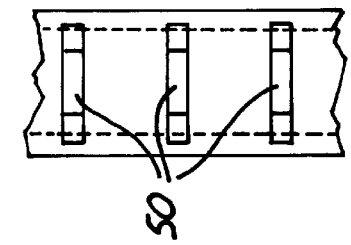
FIGS. 3B–3D are top plan, sectional, and side detail views of a first rectangular slot pattern embodiment for the three-dimensional mask of FIG. 3A.
Figure 3I:
Figure 3F:
Figure 3C:
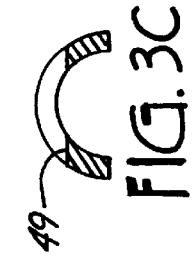
Figure 3J:
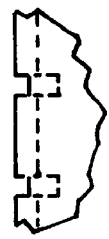
Figure 3G:
Figure 3D:
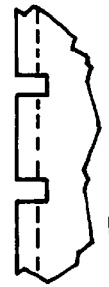
Figure 3A:
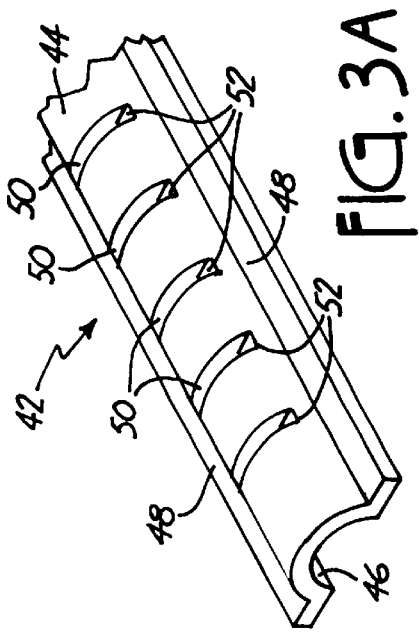
FIG. 3A is a perspective view of one three dimensional mask embodiment.

FIG. 2 is a flow chart depicting one method of forming the pattern 18 in the workpiece 12. At step 100, a manufacturer forms a mask 42 having a surface that corresponds to the nonplanar surface of the workpiece. FIG. 3A is a perspective view of a hemicylindrical mask 42 suitable for use with a cylindrical workpiece 12. This mask 42 embodiment has a hemicylindrical outer surface 44, a hemicylindrical inner surface 46, and a pair of planar clamping surfaces 48. The portion of the mask 42 located between the outer surface 44 and the inner surface 46 defines a plurality of mask apertures 50 arranged into a mask pattern 52. FIGS. 3B–3J are top plan, sectional, and side detail views of three different mask aperture 50 embodiments suitable for the three-dimensional mask 42 in FIG. 3A. Specifically, FIGS. 3B–3D and 3H–3J depict two different rectangular aperture embodiments, while FIGS. 3E–3G show an oval aperture embodiment. Those skilled in the art will recognize that the mask patterns 52 depicted in FIGS. 3A–3J may extend for the entire desired length for the pattern or for a portion thereof.

The mask 42 may be made from any material that is compatible with the chosen machining technique and that has relatively good dimensional stability. The chosen material should also be sufficiently wear resistant so that the mask 42 can be used to produce patterns 18 on large number of workpieces 12. Suitable materials include, without being limited to, stainless steel, aluminum, brass, and bronze. Polymeric, glass, ceramic masks 42 are also within the scope of the present invention. It is desirable to fabricate the mask 42 such that the diameter of the curved inner surface 46 is slightly larger than the sum of the OD of the workpiece tube 12 and the photoresist layer 36 thickness.

Referring again to FIG. 2, a desired pattern 52 is formed in an appropriately shaped mask blank at step 102. In some embodiments, the desired pattern 52 is machined into the blank using a precision, computer-controlled machining technique, such as electrical discharge machining ("EDM"), hydrodynamic machining, or laser-beam machining. It is highly desirable, nearly to the point of being imperative, that the machining and/or deburring process used to fabricate the mask 42 provide a smooth burr free finish to prevent scratching of the photoresist layer 36.

Those skilled in the art will recognize that the dimensions of the pattern 52 are determined by the degree of columniation of the exposure light source (not shown), by the desired dimensions of the holes 20 to be formed in the workpiece 12, and by the radial position of the holes. That is, as shown in FIGS. 4 and 5, the thickness of the photoresist layer 36 will allow some light beams 55 to pass between the mask 42 and the workpiece 12. These light beams will illuminate an arc, labeled "D" in FIG. 4 and "E" in FIG. 5, below a top edge 49 of the mask aperture 50. The length of this arc will depend on the angular width and location of the mask aperture 50. Apertures 50 having a top edge 49 located closer to the 90-degree point will produce a shorter arc than will those located farther away (i.e., arc E<arc D).

At step 104 in FIG. 2, a particulate and contamination free exterior surface 13 is prepared for photoresist adhesion. Those skilled in the art will recognize that the selection of a cleaning agent and a cleaning methodology is guided by material compatibility with the workpiece 12 in use and by the contaminants requiring removal. Some embodiments of the present invention use an acidic, neutral, or alkaline detergent system coupled with the use of ultrasonic agitation. This choice is driven by the workpiece material and the level of organic contaminants on the exterior surface 13. After cleaning, the part 12 is rinsed thoroughly with deionized water ("DLH2O") and dried thoroughly inside and out.

Figure 6:
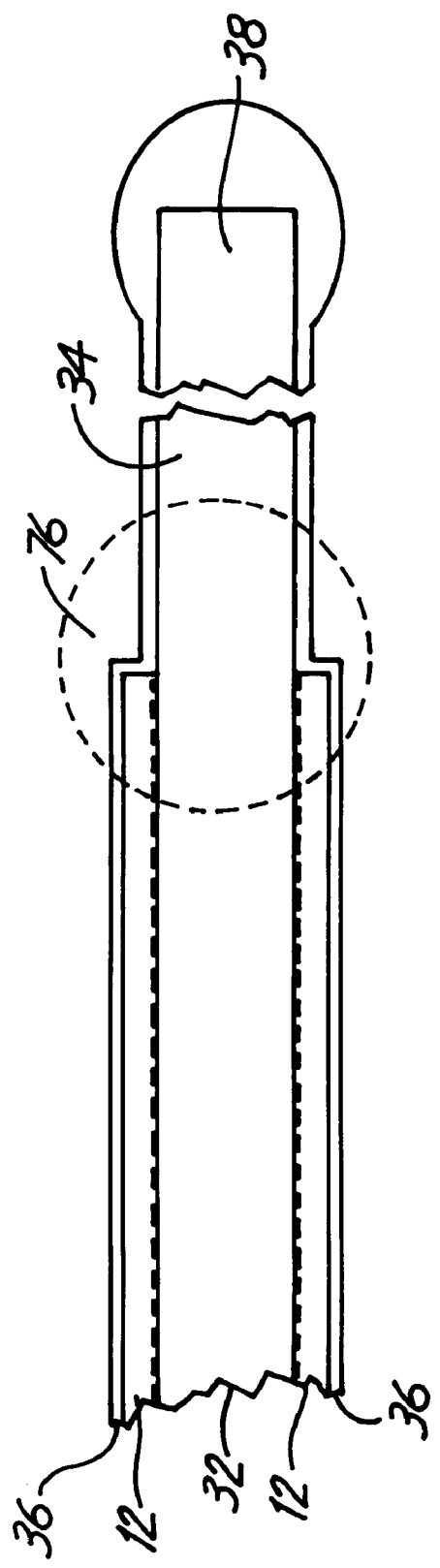
FIG. 6 is a sectional view of one selected workpiece having a wire/plug and a photoresist coating.
Figure 7A:
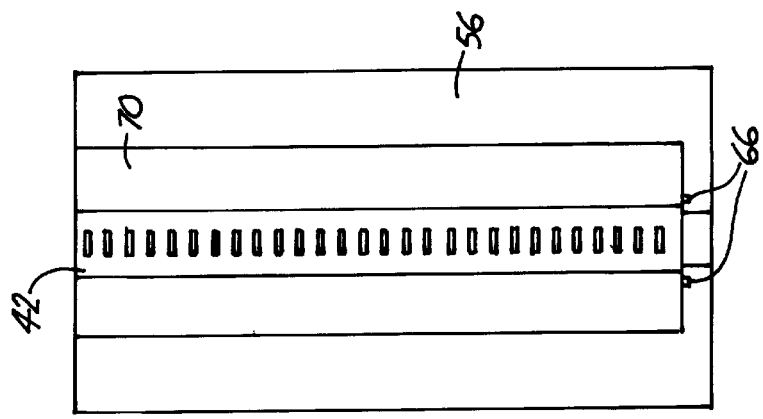
FIG. 7A is a top plan view of one mask holding fixture embodiment having a mask embodiment attached thereto.
Figure 7B:
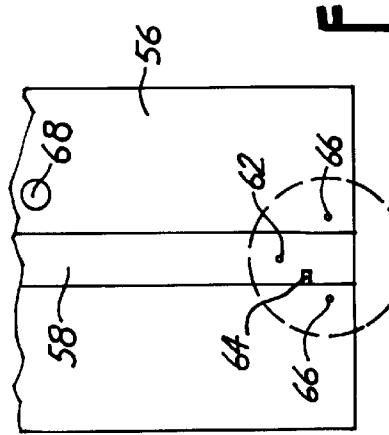
FIG. 7B is a fragmentary top plan view of the mask holding fixture embodiment of FIG. 7A, with the mask removed for clarity.
Figure 7C:
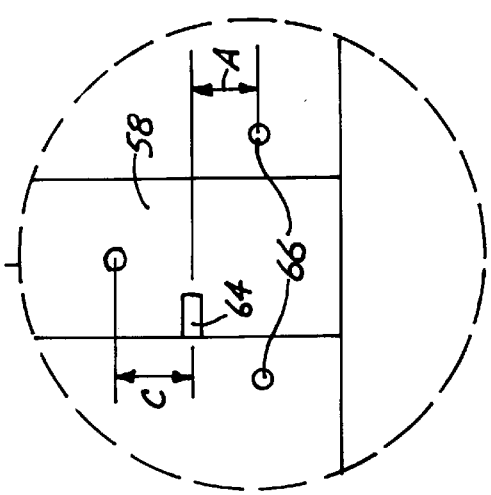
FIG. 7C is a detailed plan view of the mask alignment pins in FIGS. 7A and 7B.

Embodiments having interior lumens 14 should be sealed at step 106 so that the lumen 14 does not become clogged with photoresist. One suitable method of sealing the lumen 14 is to insert a plug 32 into the lumen 14. FIG. 6 shows a plug 32 embodiment suitable for use in a cylindrical lumen 14. The plug 32 in this embodiment is a cylindrical wire having an OD slightly smaller than the ID of the lumen 14 and a length somewhat greater than the workpiece 12. The wire can be made from any material. However, it is desirable that the wire be made from a material that is relatively unaffected by the chemicals and processing environments used to pattern the workpiece 12. For example, a steel workpiece 12 could use a stainless steel wire. Similarly, a Nitinol workpiece 12 could use a platinum ("Pt") wire because it would be inert to the usual etchant (i.e., HF/HNO3), thus reducing the possibility of hydrogen embrittlement known to be a concern within NiTi tubes. Other plug 32 embodiments capable of releasibly sealing the lumen 14 are also within the scope of the present invention.

Next, at step 108, the workpiece 12 is coated with photoresist and baked. In order to provide a photoresist layer 36 of appropriate thickness to withstand the physical contact of mask alignment and the chosen etching environment, the workpiece 12 can be dip coated in a suitable liquid photoresist, such as SHIPLEY PHOTOPOSIT SP 2029-1 manufactured by the Shipley Company, Inc. This particular photoresist is desirable because its solids content (i.e., its viscosity) may be altered to produce a coating 36 of about 6–10 micrometers thick when the workpiece is withdrawn at about 5–10 cm/in. However, any light sensitive chemical capable of bonding to the workpiece 12 and capable of withstanding the chosen etching environment is within the scope of the present invention.

The coating 36 can baked onto the workpiece 12 in any appropriate manner, such as 30 –45 minutes at 80–90 degrees Celsius in a forced draft (preferred) or in a convection oven. Those skilled in the art will recognize that the above specific conditions referenced can vary and should be optimized for differing applications.

Embodiments using a dip process for applying the photoresist will generally have a small "bulb" 38 of photoresist at the end of the plug 32. This bulb 38 may be snipped off or left intact as determined by any interference caused in the subsequent align and expose steps. If snipped off, it is desirable to leave as much of the plug 32 protruding as possible.

At step 110, the mask 42 is aligned with the workpiece 12. FIGS. 7A–7C and 8A–8C show a stage 56 embodiment that may be used to accurately position the workpiece 12 relative to the mask 42. This stage 56 embodiment has a hemicylindrical substrate channel 58 machined into its top surface 60, a pair of mask alignment pins 66, and a vacuum port 68. The substrate channel 58 has a first stop 62 and a second stop 64 located near one end. A mask holding fixture 70 fits over the mask 42 and holds it against a perforated area 71 of the top surface 60. The stage 56 may, in turn, be connected to a hollow base 72. The hollow base defines a vacuum manifold 74 that operably connects the vacuum port 68 to a vacuum source (not shown).

The mask 42 and the workpiece 12 may be aligned in this embodiment by placing the photoresist-coated workpiece 12 in the hemicylindrical channel 58 and by pushing the workpiece 12 against one of the stops 62 or 64. The mask holding fixture 70 is then closed over the workpiece 12, the alignment is checked, and a vacuum is pulled between the stage 56 and the mask holder 70 to provide an intimate contact between the workpiece 12 and mask 42.

Referring again to FIG. 2, a UV exposure lamp (not shown) is fired at step 112 to expose those portions of the photoresist layer 36 that are not protected by the mask 42. At step 114, the exposed resist 36 is immersed in a suitable developer solution, such as SHIPLEY PHOTOPOSIT 303A (an aqueous alkaline developer). At step 116, the exposed resist 36 is dissolved away using an appropriate solvent. Completion of this step 116 leaves a positive image of the slot pattern 18 in the photoresist coating 36. The part is then thoroughly rinsed in DLH2O and blown dry.

After developing and rinsing, the part is inspected to assure the quality and integrity of the generated pattern. FIG. 6 depicts an area 76 requiring special inspection attention for damage to the photoresist 36. At step 118 in FIG. 2, those portions of the workpiece 12 exposed during step 116 are controllably eroded away using a suitable etching process. Suitable etching processes include, without being limited to, chemical, plasma, and reactive ion etching.

After the etching step 118 is complete, the plug wire 32 is removed and workpiece 12 is immersed in an appropriate photoresist remover, such as SHIPLEY PHOTOPOSIT REMOVER 112A. The workpiece 12 is then thoroughly rinsed and washed with appropriate solvents, such as acetone followed by isopropyl alcohol. Those skilled in the art will recognize that steps 104–118 can be repeated on another workpiece 12 using the same mask 42.

FIGS. 9–11 illustrate a step/jog technique that may be used to create a complex pattern 18 using a comparatively simple mask 42. Specifically, FIGS. 9A–9C show a portion 34 of the plug wire 32 that protrudes 2–3 cm beyond the end of the workpiece 12. This protrusion 34 may be bent into an approximate 90-degree angle and used to relate the angular position relationship between the mask 42 and the workpiece 12. Embodiments using this "indicator pointer" 35 should have a sufficient frictional fit between the plug wire 32 and the cylindrical lumen 14 of the tube 12 to preclude spontaneous or unintended relative motion. That is, there should be enough friction so that the wire 32 will not rotate relative to the tube 12 unless the manufacturer intends for such rotation. The length of the bent indicator pointer 35 is arbitrary. However, those skilled in the art will recognize a precise angular position can be observed more easily with a longer indicator pointer 35 than with a shorter indicator pointer 35.

The indicator pointer 35, or another device capable of indicating relative angular position, can be used to repeat the mask pattern 52 at regular intervals around the circumference of the workpiece 12. The first step in one such embodiment is to align the indicator pointer 35 at 0 degrees (see FIG. 10) with the workpiece 12 jogged against the first stop 62. The UV exposure lamp is then fired to expose those portions of the photoresist layer 36 that are not protected by the mask 42. Next, the indicator 35 is aligned at 90 degrees with the workpiece 12 jogged against second stop 64. The UV exposure lamp is fired a second time to expose the mask pattern 52 onto a second portion of the photoresist layer 36. Those skilled in the art will recognize that the first stop 62 sits inside the notch 15 and does not contact the workpiece 12 when the workpiece 12 is jogged against the second stop 64 (see FIG. 11). The next step is to expose the photoresist layer a third time with the indicator 35 at 180 degrees and with the workpiece 12 jogged against the first stop 62. Finally, the workpiece is aligned and exposed with the indicator 35 at 270 degrees and with the workpiece jogged against the second stop. Those skilled in the art will recognize that a similar procedure could be used to generate a different radial spacing and/or pattern offsets and that the basic manufacturing process could be easily automated using well-known manufacturing techniques.

The present invention provides numerous advantages over conventional manufacturing techniques. For example, the present invention provides a method of using a nonplanar mask to produce large numbers of small holes or slots on a nonplanar workpiece. The present invention also provides a method of using a machined metal mask to accurately generate photolithographic patterns on three dimensional workpieces. In addition, the present invention uses the techniques of "rotating" and "jogging" of the workpiece to produce relatively complicated patterns with a comparatively simple mask. This rotating and jogging technique can, in particular, be used to fabricate a radially spaced, offset pattern on the circumference of a tubular workpiece.

Although the present invention has been described in detail with reference to certain embodiments thereof, variations are possible. For example, the methods and apparatus described in this specification could be used on non-cylindrical workpieces 12. Those skilled in the art will recognize that the mask 42 and the stage 56 in these embodiments could be altered to receive the nonplanar surface(s) of that particular workpiece 12. In addition, the present invention could use multiple offset light sources, rather than a single overhead light source to reduce the "thickness" effect described with reference to FIGS. 4 and 5. The present invention could also use a stepping motor 67 or other controllable actuating apparatus, in place of or in conjunction with the stops 62 and 64, to align the workpiece 12 with the mask 42. Also, the mask 42 in some embodiments could be made from a flexible or compliant material and could be laid over the nonplanar surface of the workpiece 12.

Those skilled in the art will also recognize that the accompanying figures and this description depicted and described embodiments of the present invention, and features and components thereof. With regard to means for fastening, mounting, attaching or connecting the components of the present invention to form the mechanism as a whole, unless specifically described otherwise, such means were intended to encompass conventional fasteners such as machine screws, nut and bolt connectors, machine threaded connectors, snap rings, screw clamps, rivets, nuts and bolts, toggles, pins and the like. Components may also be connected by welding, friction fitting, adhesives, or deformation, if appropriate. Electrical connections or position sensing components may be made using appropriate electrical components and connection methods, including conventional components and connectors. Unless specifically otherwise disclosed or taught, materials for making components of the present invention were selected from appropriate materials, such as metal, metallic alloys, fibers, polymers and the like, and appropriate manufacturing or production methods including casting, extruding, molding and machining may be used. In addition, any references to front and back, right and left, top and bottom and upper and lower were intended for convenience of description, not to limit the present invention or its components to any one positional or spacial orientation. Therefore, it is desired that the embodiments described herein be considered in all respects as illustrative, not restrictive, and that reference be made to the appended claims for determining the scope of the invention.

We claim:

1. A photolithography apparatus for producing a selected pattern on a nonplanar surface of a workpiece, comprising:
   a stage having a receiving area adapted to receive the workpiece;
   a mask having an inner surface adapted to receive the nonplanar surface, the mask defining at least one aperture; and
   a stop associated with the stage and adapted to rotationally align the workpiece with the mask.

2. The apparatus of claim 1, further comprising:
   an exposing light source adapted to illuminate the workpiece through the at least one aperture.

3. A photolithography apparatus for forming an offset pattern in a tubular workpiece, comprising:
   a stage having a hemicylindrical substrate channel adapted to receive a tubular workpiece;
   a hemicylindrical mask defining at least one aperture; and
   at least one stop associated with the stage and adapted to position the workpiece relative to the mask.

4. The apparatus of claim 3, further comprising:
   an exposing light source adapted to illuminate the workpiece through the at least one aperture.

5. A photolithography apparatus comprising:
   a stage having a surface area adapted to receive a workpiece;
   the workpiece rotatably received by the stage;
   a rigid mask having an inner surface adapted to receive the workpiece, wherein the workpiece is rotatively positionable relative to the rigid mask and the stage, the stage including at least one stop adapted to allow selective positioning of the workpiece relative to the mask; and a light source.

6. The apparatus of claim 5 wherein the stage includes an indicator for determining angular position of the workpiece.

7. The apparatus of claim 5 wherein the light source includes multiple offset light sources.

8. The apparatus of claim 5 further comprising a stepping motor coupled to the workpiece.

9. The apparatus of claim 5 wherein the stage includes a hemicylindrical channel adapted to receive a tabular workpiece.

10. The apparatus of claim 5, wherein the mask includes a hemicylindrical surface.

11. A photolithography apparatus comprising:
    a non-planar workpiece;
    a non-planar mask configured to provide a selected pattern for a portion of the non-planar workpiece;
    a stage including a surface area configured to receive the non-planar workpiece, wherein the workpiece is configured to be selectively rotatable relative to the non-planar mask;
    a stop associated with the stage and configured to rotationally align the non-planar workpiece with the non-planar mask.

12. The apparatus of claim 11 further comprising a light source configured to illuminate the non-planar workpiece through an at least one aperture in the non-planar mask.

13. The apparatus of claim 11 further comprising an indicator removably disposed within the non-planar workpiece, the indicator configured to determine angular position of the non-planar workpiece relative to the non-planar mask.

* * * * *